United States Patent
Anh et al.

[19]

[11] Patent Number: 6,108,230

[45] Date of Patent: Aug. 22, 2000

[54] SEMICONDUCTOR DEVICE WITH DATA LINE ARRANGEMENT FOR PREVENTING NOISE INTERFERENCE

[75] Inventors: Jin-Hong Anh; Hae-Young Rha; Joo-Hiuk Son, all of Seoul, Rep. of Korea

[73] Assignee: Hyundai Electronics Industries Co., Ltd., Ichon-Shi, Rep. of Korea

[21] Appl. No.: 09/251,323

[22] Filed: Feb. 17, 1999

[30] Foreign Application Priority Data

May 30, 1998 [KR]  Rep. of Korea ..................... 98/20096

[51] Int. Cl.$^7$ ..................................................... G11C 5/06
[52] U.S. Cl. ............................................... 365/63; 365/69
[58] Field of Search ................................. 365/63, 52, 72, 365/69, 190

[56] References Cited

U.S. PATENT DOCUMENTS

| | | | |
|---|---|---|---|
| 4,366,559 | 12/1982 | Misaizu et al. ........................ | 365/205 |
| 5,107,459 | 4/1992 | Chu et al. ................................. | 365/63 |
| 5,144,583 | 9/1992 | Oowaki et al. ......................... | 365/206 |
| 5,214,601 | 5/1993 | Hidaka et al. ............................ | 365/63 |
| 5,602,772 | 2/1997 | Nakano et al. ........................... | 365/63 |
| 5,602,773 | 2/1997 | Campbell .................................. | 365/63 |

*Primary Examiner*—Tan T. Nguyen
*Attorney, Agent, or Firm*—Fleshner & Kim, LLP

[57] ABSTRACT

A semiconductor memory device having a data line structure is disclosed which is capable of eliminating a noise interference between data lines and enhancing an integrity of a memory device. In the semiconductor memory device, a pair of data lines are not aligned on the identical plane. Namely, it is separated into an upper layer line and a lower layer line using an insulation film, wherein the data lines forming a plurality of pairs of the data lines are aligned in the upper wiring line and lower wiring line on a semiconductor substrate, and have at least one intersected portion therebetween.

10 Claims, 7 Drawing Sheets

——— 1st LAYER  ===== 2nd LAYER

——— UPPER LAYER   ===== LOWER LAYER

SEMICONDUCTOR DEVICE WITH DATA LINE ARRANGEMENT FOR PREVENTING NOISE INTERFERENCE

BACKGROUND OF THE INVENTION

1. Field of the Invention

The present invention relates to a semiconductor device with a data line arrangement for preventing a noise interference, and in particular to an improved semiconductor device with a data line arrangement for preventing a noise interference which is capable of decreasing or eliminating a noise interference among data lines of a high-integrated memory device.

2. Description of the Background Art

A digital system with a high performance and fast operation is increasingly needed. In order to implement such digital system, a high-integrated memory is generally used. The integrity of the memory device has been increased in combination with an improved memory cell structure and fabrication method. However, as the integrity is increased, a noise interference in a memory device is increased. Namely, when the integrity of the memory device is increased, the distances between data lines is decreased, and a coupling capacitance between data lines is also increased thereby. Therefore, the noise interference is increased.

FIG. 1 is a schematic view illustrating a semiconductor device which is implemented by combining a folded data line and a vdd/2 precharge technique. As shown therein, the data lines DB0, /DB0, DB1, and /DB1 which are regularly spaced-apart are horizontally arranged, and a sense amplifier SAi (i=1,2, . . . ) is connected to one end of each pair of data lines DBi, /DBi (i=1,2, . . . ). The pair of data lines DBi, /DBi and a word line WL0 are intersected each other, and a memory cell M is connected at an intersected portion between the data line and the word line.

As shown in FIG. 1, in the regularly spaced-apart data lines, assuming that the signal at the data line DB0 is –Vs, the signal voltage of Vdd/2 is detected at the data line /DB0 based on the Vdd/2 precharge method. A noise of –δ1 is generated at the data line /DB0 based on the coupling capacitance between the data lines DB0 and /DB0. In addition, when a signal voltage at the data line DB1 neighboring with the data line /DB0 becomes –Vs, the noise of –δ1 is generated based on the coupling capacitance between the data lines /DB0 and DB1. As a result, the signal at the data line /DB0 becomes Vdd/2–2δ1, and the signal voltage difference with respect to the data line DB0 is decreased. The thusly decreased signal voltage is inputted into the sense amplifier, and a signal which is different from the signal read from a memory cell may be outputted. Therefore, it is impossible to correctly read the data from the memory cell. A method is disclosed, which is capable of decreasing a noise interference by balancing the coupling capacitance between the data lines.

FIG. 2 is a schematic view illustrating the structure for decreasing a noise interference between the data lines (or bit lines).

Four pairs of the data lines DBi, /DBi(i=1,2,3,4) are shown therein. Each data line consists of the data lines DBi and /DBi. Each pair of the data lines consisting of the data lines DBi and /DBi is connected with the sense amplifier SAi. Namely, the data lines DB0 and /DB0 are connected with the sense amplifier SA0, and the data lines DB1 and /DB1 are connected with the sense amplifier SA1, and the data lines DB2 and /DB2 are connected with the sense amplifier SA2, and the data lines DB3 and /DB3 are connected with the sense amplifier SA3. Each sense amplifier SAi is connected at the ends of the data lines DBi and /DBi. The sense amplifiers SAi and SA(i+1) are connected at the opposed end of the data lines. In addition, the word lines WLi(i=0,1, . . . ) are insulatively intersected by the four pairs of the data lines. The memory cells M are provided at the intersected portion between the word lines WLi (in the drawings, only two word lines WL0 and WL1 are shown) and the data lines DBi and /DBi. In addition, the data lines DB0 and /DB0 are twisted at an intermediate position of the data lines in the longitudinal direction. In addition, the data lines DB2 and /DB2 are twisted at an intermediate position of the data lines in the longitudinal direction. Here, the twisted portion of the data lines DB0 and /DB0 is called as a twisted crossing section T1. The twisted portions of the data lines DB1 and /DB1 are called as twisted crossing sections T2 and T3. The data lines DB1 and /DB1 forms twisted crossing sections T2 and T3 at the ¼ position and ¾ position in the longitudinal direction. The twisted crossing section T1 of the neighboring data lines DB0 and /DB0 is formed at an intermediate position between the twisted crossing sections T2 and T3 of the data lines DB1 and /DB1. In addition, the solid line shown in FIG. 2 represents a first layer wiring and the dotted line represents a second layer wiring. Namely, the solid line and dotted line represent the layers which are different from each other.

The structure of the twisted data line arrangement has the following advantages. The data line DB0 among the twisted data lines generates a noise interference due to the coupling capacitances of the neighboring data lines DB1 and /DB1 and the data line /DB0. The data line /DB0 generates a noise interference due to the coupling capacitance of the data lines DB0, DB1 and /DB1. Therefore, in the signal voltage outputted from the sense amplifier positioned at the end portions of the data lines DB0 and /DB0, the noise interference is offset, so that it is possible to stably read the data. In addition, in the neighboring data lines DB1 and /DB1, since the noise interference is identical based on the coupling capacitance at each data line, the noise interference which affects the signal voltage of the data line is eliminated. Namely, the data line DB1 among the data lines forms a coupling capacitance in combination with the neighboring data lines DB0 and /DB0. The data line /DB1 generates the noise interference based on the coupling capacitance in combination with the neighboring data lines DB0 and /DB0 and the data line DB1 which forms a pair with the data line /DB1. Therefore, since each data line pair receives the identical noise interference from the neighboring data lines, it is possible to prevent the data reading error.

FIG. 3 is a plan view illustrating the pattern of a semiconductor device of FIG. 2.

The data lines DB0, /DB0, DB1, /DB1, DB2, /DB2, DB3, /DB3 (namely, hatched portions) are horizontally arranged on a semiconductor substrate 1 using an insulation film (not shown). The uppermost line is called as a first line, and the line lower than the first line is called as a second line, and the line lower than the second line is called as a third line. Namely, the lines are sequentially given its corresponding number down to the eighth line. The dotted portion in FIG. 3 represents a wiring line or by-pass line for connecting the data lines. The wiring line may be formed in a lower layer of the data line or in an upper layer thereof. Assuming that the data line is a first conductive layer formed on the upper surface of the semiconductor substrate 1, and the connection wiring line is formed therebelow, the connection wiring line may be formed using a diffusion layer having a conductivity by implanting a dopant into the semiconductor substrate 1. Namely, the diffusion layer 2 is formed on the surface of the semiconductor substrate 1, and an insulation layer is formed on the upper surface of the semiconductor substrate 1. The data lines DB0 and /DB0, which are the first conductive layer, are arranged on the upper surface of the insulation layer. At this time, the data line DB0 among the data lines is formed of a first conductive layer and is longitudinally extended. The data line DB0 is horizontally extended from the first line and is downwardly curved at the intermediate portion, and then is horizontally extended toward the second line. The data line /DB0 is broken or separated at the portion in which the diffusion layer 2 is formed. The data line /DB0 formed on the left side of the diffusion layer is horizontally arranged with respect to the second line, and the data line /DB0 formed in the right side of the diffusion layer is formed at the first line, and the data line /DB0 formed spacedly from the first and second lines is connected with the diffusion layer 2 through contact holes 2a and 2b. Namely, the twisted crossing section of the data line is implemented on the semiconductor substrate using a diffusion layer. The insulation layer (not shown) is formed on the data lines DB0, . . . , /DB3 formed as the first conductive layer instead of the diffusion layer 2. In addition, the second conductive layer is formed as a wiring line arranged on the insulation layer (not shown) at the portion of the diffusion layer, so that the separated lines are connected for thereby implementing a twisted data line. If the data lines DB0, . . . , /DB3 are formed as a second layer wiring line among the multilayer wiring lines formed on the semiconductor substrate, the connection wiring line for forming the twisted crossing section may be implemented using the first layer wiring line arranged below the second layer wiring line or the third layer wiring line arranged on the second layer wiring line.

The twisted crossing section T1 of the data lines DB0 and /DB0 is formed at the intermediate portion of the twisted crossing sections T2 and T3 of the neighboring data lines DB1 and /DB1.

As described above, a method is disclosed, which is capable of eliminating a noise interference by balancing the coupling capacitance between the neighboring data lines. However, in the conventional art, the data lines are formed on the identical plane, and the connection wiring line is formed on a layer which is different from the data lines.

Namely, since the data lines are formed on the identical plane, the occupying area of the data lines is increased in the semiconductor device. Therefore, it is difficult to increase the integrity of the semiconductor device.

SUMMARY OF THE INVENTION

Accordingly, it is an object of the present invention to provide a semiconductor device with a data line arrangement for preventing a noise interference which overcomes the aforementioned problems encountered in the background art.

It is another object of the present invention to provide a semiconductor device with a data line arrangement for preventing a noise interference which is capable of providing an upper layer and a lower layer using an insulation film without arranging a pair of data lines on the identical plane.

To achieve the above objects, there is provided a semiconductor device with a data line arrangement for preventing a noise interference according to a first embodiment of the present invention wherein the data lines forming a plurality of pairs of the data lines are aligned in the upper wiring line and lower wiring line on a semiconductor substrate, and have at least one intersected portion therebetween in a semiconductor memory device including a plurality of pairs of data lines, a plurality of word lines insulatively intersecting the data lines, a plurality of memory cells aligned on a corresponding intersection between the word lines and the data lines, and a plurality of sense amplifiers each connected with one end of each data line.

To achieve the above objects, there is provided a semiconductor device with a data line arrangement for preventing a noise interference according to a second embodiment of the present invention wherein the data lines forming a plurality of pairs of the data lines are aligned in the upper layer lines on a semiconductor substrate, the data lines are intersected at least one time in the longitudinal direction and vertical direction of the data line on the identical plane, the data lines forming a plurality of neighboring pairs of the data lines are aligned in the lower wiring line on the semiconductor substrate, and the data lines are intersected at least one time in the longitudinal direction and vertical direction of the data line on the identical plane of the lower wiring line in a semiconductor memory device including a plurality of pairs of data lines, a plurality of word lines insulatively intersecting the data lines, a plurality of memory cells aligned on a corresponding intersection between the word lines and the data lines, and a plurality of sense amplifiers each connected with one end of each data line.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
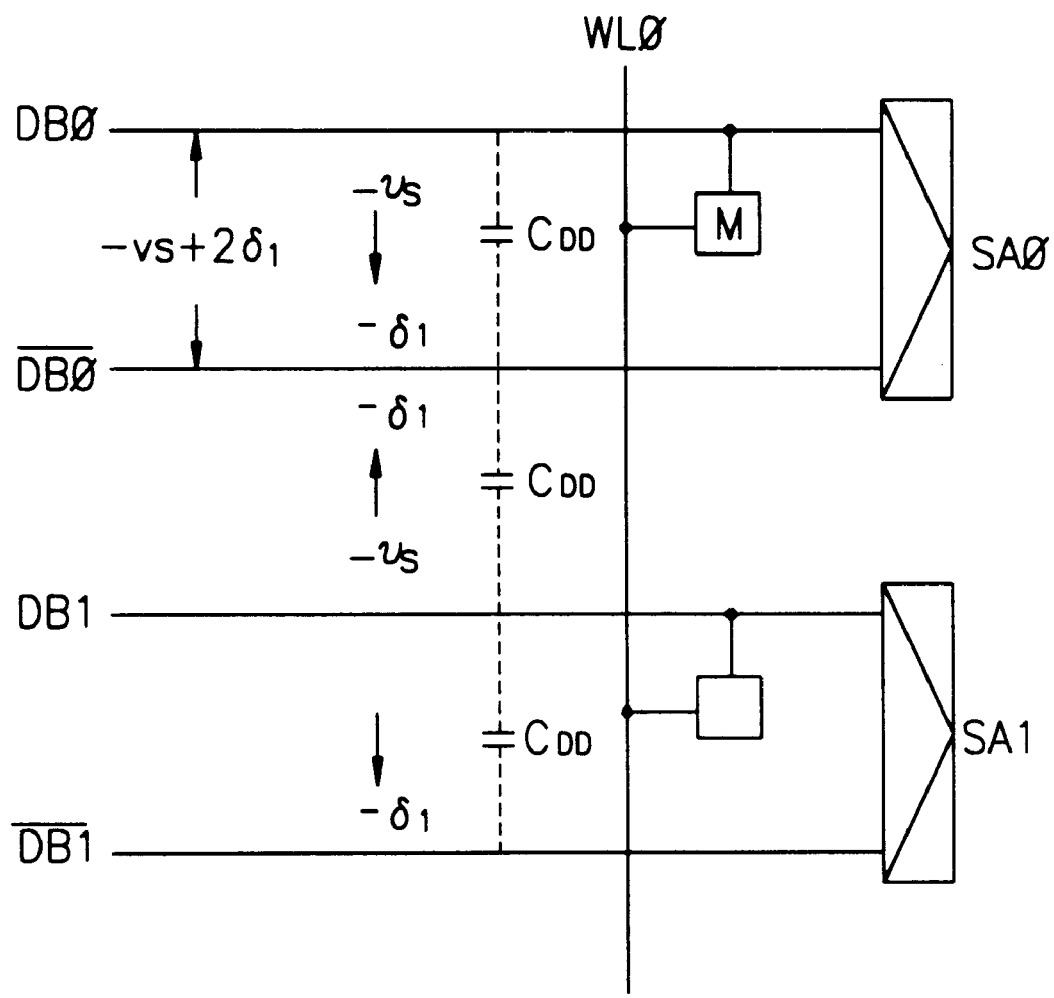
FIG. 1 is a schematic view illustrating the structure of a data line arrangement for a conventional semiconductor device.
Figure 2:
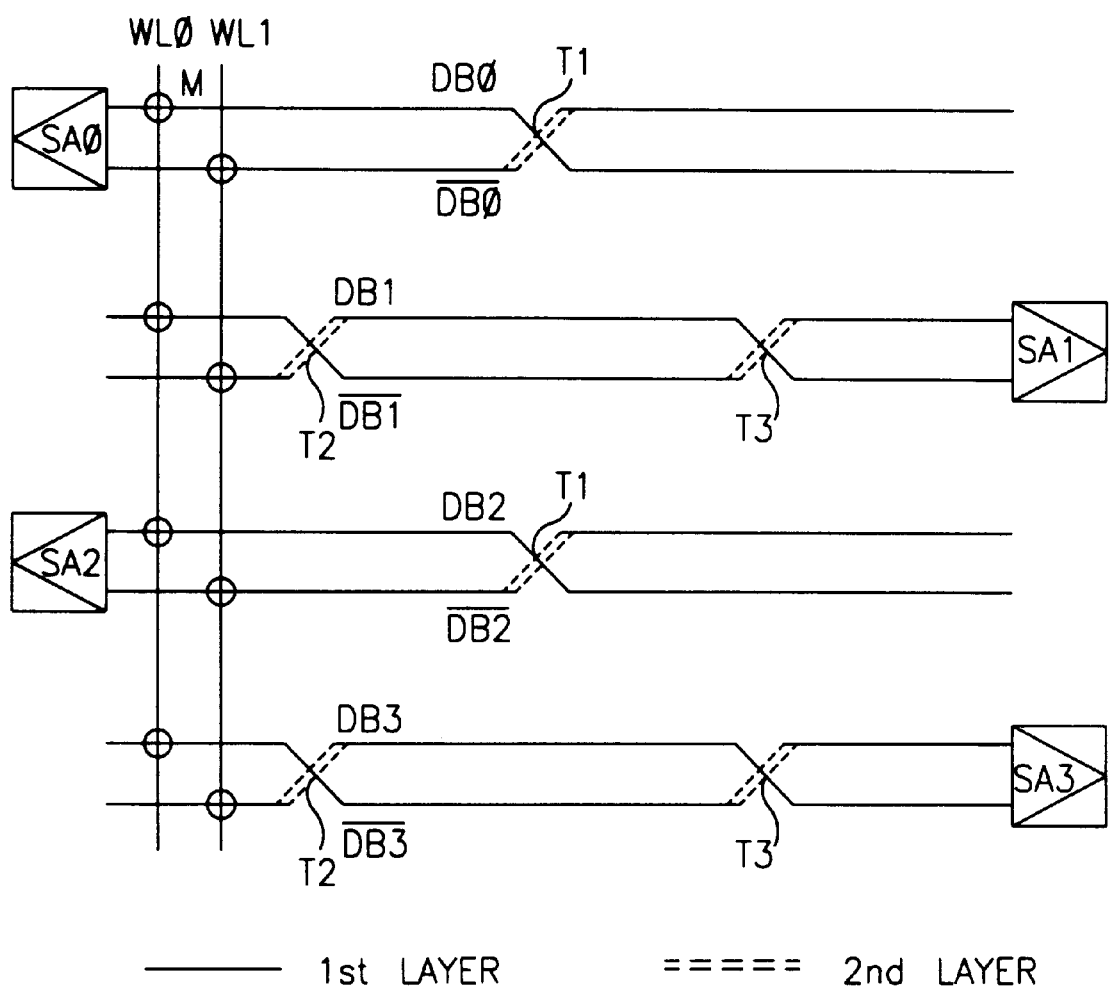
FIG. 2 is a plan view illustrating the major portions of the semiconductor device of FIG. 1.

The position and connection structure of a data line, a word line, a sense amplifier, a memory cell, etc. according to the present invention are the same as FIG. 2 except the facts that the data lines are not arranged on the identical plane. Namely, the data lines are formed in three dimension by separating the lines into an upper wiring line and a lower wiring line.

Figure 4:
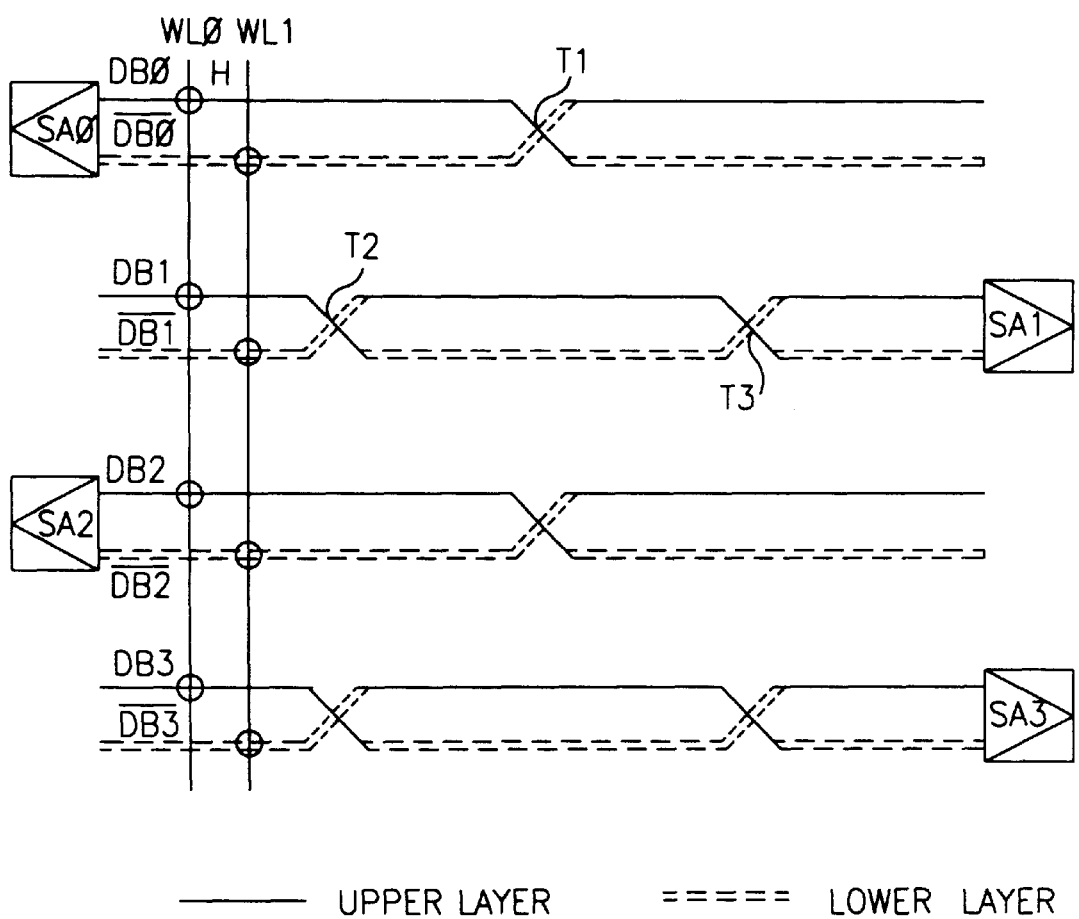
FIG. 4 is a schematic view illustrating an arrangement of a data line for a semiconductor device according to a first preferred embodiment of the present invention.

FIG. 4 is the structure of an arrangement of a data line according to the present invention. As shown therein, the solid line represents an upper layer wiring line, and the dotted line represents a lower layer wiring line. The data lines DBi and /DBi are alternately formed between the upper and lower layers with respect to the insulation layer when the data lines passes through each twisted crossing portion. For example, the data lines DB0 and /DB0 will be explained. When the data line DB0 is formed in the upper layer, and the data line /DB0 is formed in the lower layer. After the twisted crossing section T1 of the data lines, the data line /DB0 is formed in the upper layer, and the data line DB0 is formed in the lower layer.

Figure 3:
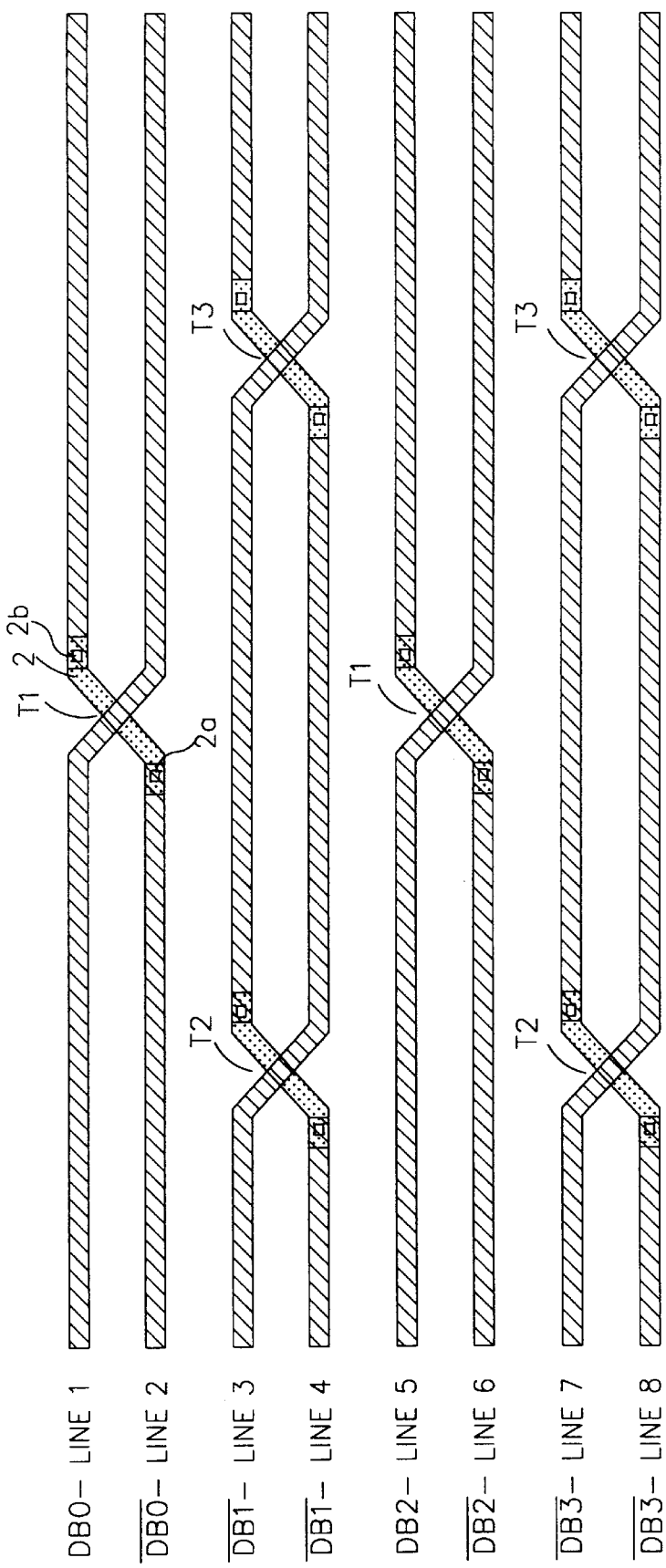
FIG. 3 is a plan view illustrating the pattern of the semiconductor device of FIG. 2.
Figure 5:
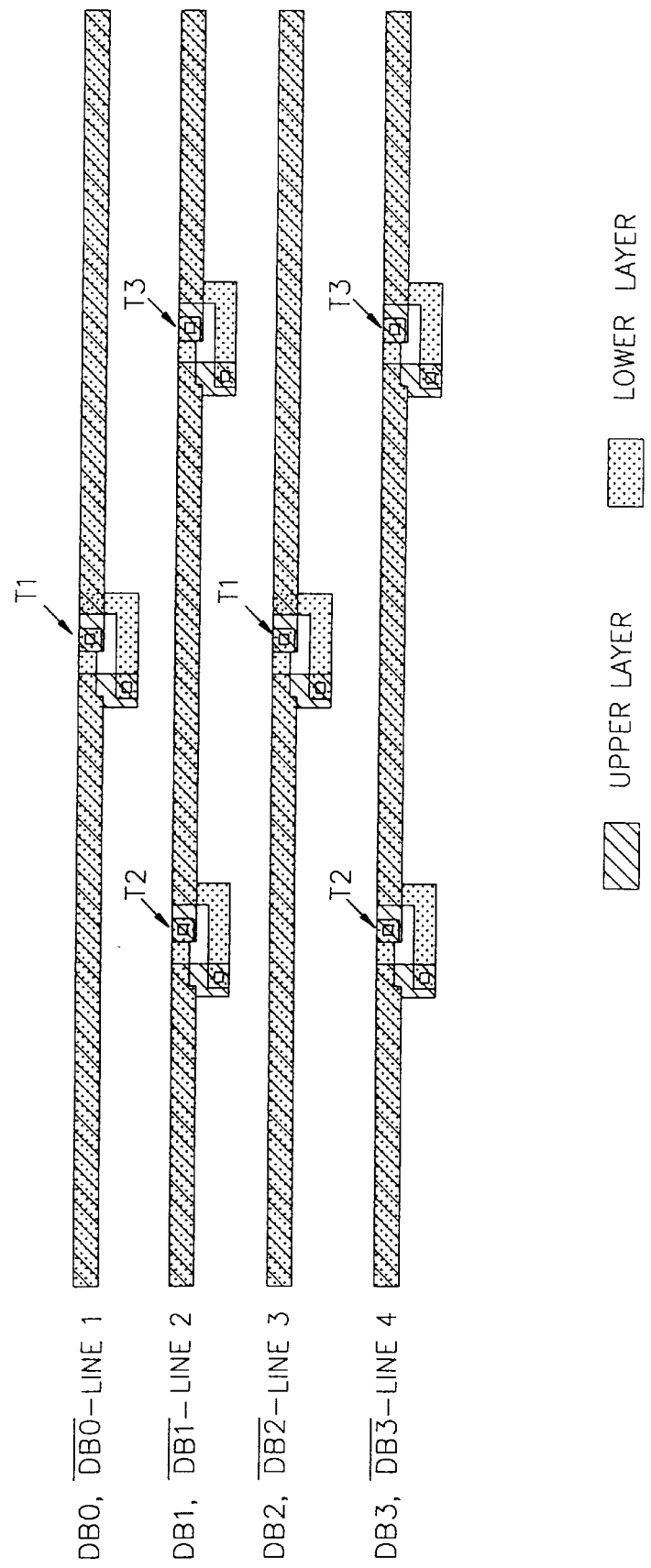
FIG. 5 is a plan view illustrating the structure of a data line arrangement for a semiconductor device of FIG. 4.

FIG. 5 is a view illustrating the upper wiring line and lower wiring line which form the data lines and are overlaid on the identical position with respect to the insulation film. Therefore, in the present invention, since the occupying area of the data lines on the semiconductor substrate is significantly decreased compared to the conventional art, it is possible to enhance the integrity of the semiconductor device. Namely, in the conventional art, as shown in FIG. 3, the area of eight lines is required for forming the data lines DB0, . . . , /DB3 on the identical plane of the semiconductor substrate. However, in the present invention, the area of four lines is required for forming the same on the semiconductor substrate as shown in FIG. 4.

Figure 6:
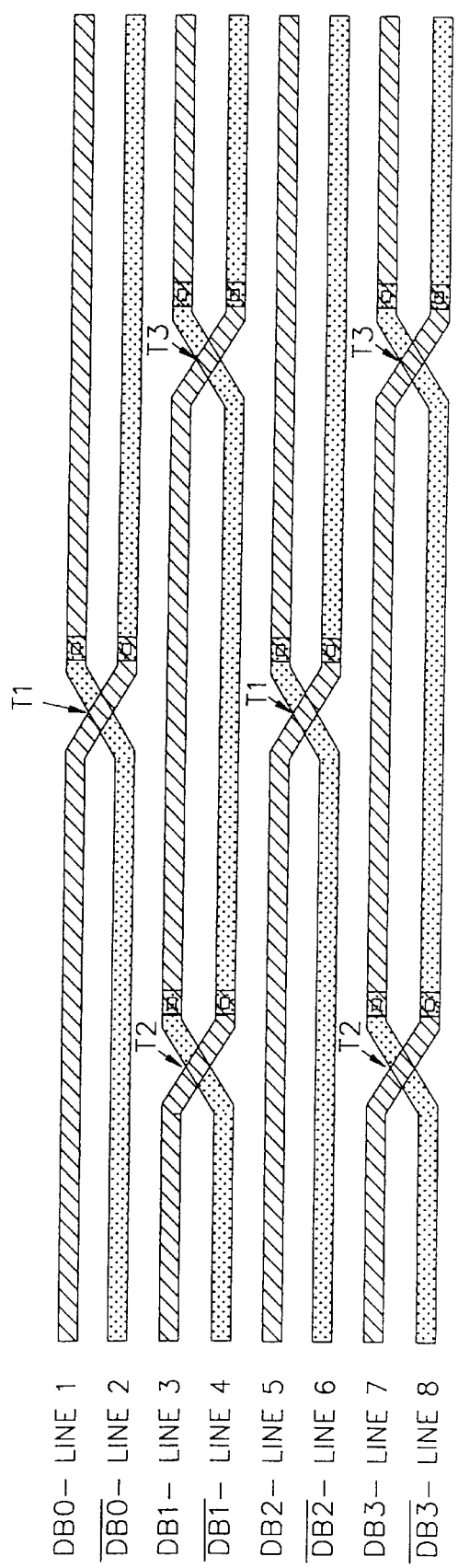
FIG. 6 is a plan view illustrating the structure of a data line arrangement for a semiconductor device according to a second embodiment of the present invention.

FIG. 6 is a view illustrating another embodiment of the present invention. As shown therein, the data lines DBi and /DBi are not overlaid on the identical position. Namely, similarly to the conventional art, the data lines DBi and /DBi are slightly misaligned. However, since the data lines are formed in the upper layer and lower layer, it is possible to decrease the distance between the data lines compared to the data lines which are aligned on the identical plane. Namely, since the neighboring data lines are aligned in the upper and lower layers, and the distance of the data lines is diagonally formed compared to the horizontal distance of the conventional art, so that it is possible to decrease the coupling capacitance for thereby decreasing the distance between the data lines. Therefore, it is possible to enhance the integrity of the semiconductor device.

Figure 7:
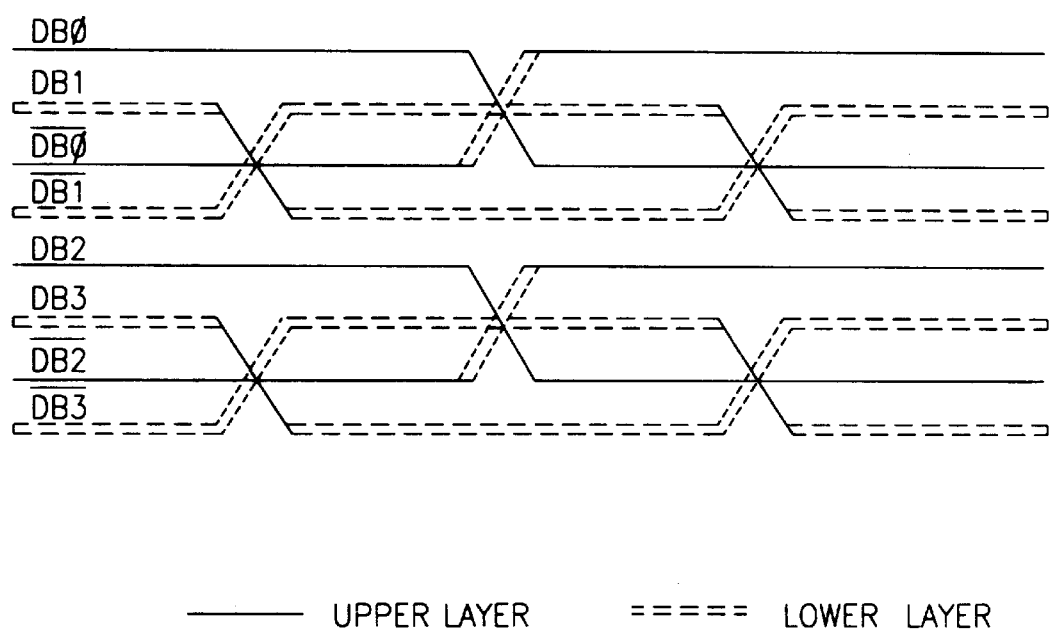
FIG. 7 is a schematic view illustrating the structure of a data line arrangement for a semiconductor device according to a third embodiment of the present invention.

FIG. 7 is a view illustrating another alignment structure of a data line according to another embodiment of the present invention. A pair of data lines (for example, DB0 and /DB0) are formed at both sides of one data line (DB1 or /DB1) among the neighboring data lines. In addition, the data lines DB1 and /DB1 are formed at both sides of one data lines (DB0 or /DB0) among the neighboring data lines between the data lines DB1 and /DB1. The twisted crossing section of the data lines DB0 and /DB0 is formed at an intermediate portion of the twisted crossing position of the neighboring data lines DB1 and /DB1. In the thusly constituted structure, the neighboring data lines DB0 and /DB0 are formed in the upper wiring line, and the neighboring data lines DB1 and /DB1 are formed in the neighboring data lines DB1 and /DB1.

As described above, in the present invention, since the data lines are separated into the upper layer and lower layer, it is possible to enhance the integrity of the semiconductor device. The coupling capacitance is significantly decreased.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. In a semiconductor memory device including a plurality of pairs of data lines, a plurality of word lines insulatively intersecting the data lines, a plurality of memory cells aligned on a corresponding intersection between the word lines and the data lines, and a plurality of sense amplifiers each connected with one end of each of the plurality of pairs of data lines, wherein each of the pairs of the data lines have a first data line and a second data line respectively disposed in an upper wiring line and a lower wiring line extending in a first direction on a semiconductor substrate, wherein the first data line and the second data line are vertically aligned except in a twisted crossing section, wherein adjacent pairs of data lines do not overlap, and wherein the first data line transitions from the upper wiring line to the lower wiring line in the twisted crossing section through a connection consisting of a vertical contact.

2. The device of claim 1, wherein said data lines which form a plurality of pairs of the data lines are aligned on the semiconductor substrate and are separated into an upper layer and lower layer using an insulation film, and wherein the positions of the data lines of the upper layer and the position of the data lines of the lower layer are formed at a position in which the same are intersected on the identical vertical plane.

3. The device of claim 2, wherein the second data line transitions from the lower wiring line to the upper wiring line in the twisted crossing section using a path including a vertical contact hole and a portion extending in a second direction perpendicular to the first direction, wherein the portion has a length less than half a distance between the adjacent pairs of data lines.

4. The device of claim 1, wherein said twisted crossing section of the data lines is formed at an intermediate position of the twisted crossing section of the neighboring data lines.

5. In a semiconductor memory device including a plurality of pairs of data lines, a plurality of word lines insulatively intersecting the data lines, a plurality of memory cells aligned on a corresponding intersection between the word lines and the data lines, and a plurality of sense amplifiers each connected with one end of each data line, wherein a first set of the plurality of pairs of the data lines are aligned in upper layer lines on a semiconductor substrate, each of the first set of the plurality of pairs of the data lines cross at least one time in a longitudinal direction and a vertical direction of the data lines in first twisted crossing sections, wherein a plurality of neighboring pairs of the plurality of pairs of the data lines are aligned in lower layer lines on the semiconductor substrate, and each of the plurality of neighboring pairs of the data lines cross at least one time in the longitudinal direction and the vertical direction of the data lines in second twisted crossing sections.

6. The device of claim 5, wherein at least one data line of said each of the first set of the plurality of data lines is provided among the neighboring pairs of the data lines horizontally between the data lines of the neighboring pairs of data lines.

7. The device of claim 5, wherein said first twisted crossing sections of the data lines of the first plurality of pairs of the data lines is at an intermediate portion of the second twisted crossing sections of the neighboring pairs of the data lines.

8. A semiconductor device, comprising:

a plurality of pairs of data lines;

a plurality of pairs of word lines insulatively intersecting the data lines;

a plurality of memory cells, aligned to corresponding intersections between the word lines and the data lines; and a plurality of sense amplifiers coupled to one end of each of the pairs of data lines, wherein adjacent pairs of data lines are horizontally interspersed, and wherein a first set of pairs of the plurality of pairs are on a first level, a second set of pairs of the plurality of pairs are on a second level, and the first level is substantially different from the second level.

9. The device of claim 8, wherein the first set of pairs are odd numbered pairs of the plurality of pairs of data lines, and wherein the second set of pairs are even numbered pairs of the plurality of pairs of data lines.

10. The device of claim 8, wherein each twisted crossing section of the odd numbered pairs of the data lines is at an intermediate portion of a plurality of twisted crossing sections of the even numbered pairs of the data lines.

* * * * *